(12) United States Patent
Adkisson et al.

(10) Patent No.: US 7,482,675 B2
(45) Date of Patent: Jan. 27, 2009

(54) PROBING PADS IN KERF AREA FOR WAFER TESTING

(75) Inventors: James William Adkisson, Jericho, VT (US); Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 11/160,461

(22) Filed: Jun. 24, 2005

(65) Prior Publication Data

US 2007/0013071 A1    Jan. 18, 2007

(51) Int. Cl.
H01L 23/544 (2006.01)
(52) U.S. Cl. .................. 257/620; 257/48; 257/E21.521; 438/113
(58) Field of Classification Search .................. 257/48, 257/620, E21.521; 438/113
See application file for complete search history.

(56) References Cited

U.S. PATENT DOCUMENTS

| | | | | |
|---|---|---|---|---|
| 3,573,570 A | * | 4/1971 | Fuller et al. .................. | 257/763 |
| 4,726,991 A | * | 2/1988 | Hyatt et al. .................. | 428/329 |
| 4,800,418 A | * | 1/1989 | Natsui ........................ | 327/564 |
| 4,900,257 A | * | 2/1990 | Maeda ........................ | 438/532 |
| 5,977,639 A | * | 11/1999 | Seshan et al. ................ | 257/776 |
| 5,981,971 A | * | 11/1999 | Miyakawa .................... | 257/48 |
| 5,989,972 A | * | 11/1999 | Widmann et al. ............ | 438/397 |
| 6,046,101 A | * | 4/2000 | Dass et al. ................... | 438/624 |
| 6,373,143 B1 | | 4/2002 | Bell | |
| 6,429,675 B2 | | 8/2002 | Bell | |
| 6,531,709 B1 | * | 3/2003 | Kim et al. ...................... | 257/48 |
| 6,903,644 B2 | * | 6/2005 | Wang et al. .................. | 336/200 |
| 2004/0155241 A1 | | 8/2004 | Cheng et al. | |
| 2004/0173794 A1 | | 9/2004 | Yu et al. | |

FOREIGN PATENT DOCUMENTS

| | | | |
|---|---|---|---|
| JP | 2238645 A | | 9/1990 |
| JP | 2241046 A | | 9/1990 |
| JP | 09129673 A2 | | 5/1997 |
| JP | 09330963 A2 | | 12/1997 |

\* cited by examiner

*Primary Examiner*—Jerome Jackson, Jr.
*Assistant Examiner*—John Lin
(74) *Attorney, Agent, or Firm*—Schmeiser, Olsen & Watts; William D. Sabo

(57) ABSTRACT

A structure and a method for forming the same. The structure includes (a) a substrate having a top substrate surface; (b) an integrated circuit on the top substrate surface, wherein the integrated circuit includes a bond pad electrically connected to a transistor of the integrated circuit; (c) a protection ring on the top substrate surface and on a perimeter of the integrated circuit; (c) a kerf region on the top substrate surface, wherein the protection ring is sandwiched between and physically isolates the integrated circuit and the kerf region, wherein the kerf region includes a probe pad electrically connected to the bond pad, and wherein the kerf region is adapted to be destroyed by chip dicing without damaging the integrated circuit and the protection ring.

8 Claims, 7 Drawing Sheets

PROBING PADS IN KERF AREA FOR WAFER TESTING

BACKGROUND OF THE INVENTION

1. Technical Field

The present invention relates to wafer testing, and more specifically, to probing pads on wafer for wafer testing.

2. Related Art

In a conventional semiconductor fabrication process, multiple semiconductor chips (i.e., integrated circuits) can be fabricated on the same wafer. Each of the chips comprises bond pads on the chip's perimeter which provide electrical access to underlying devices of the chip. During packaging of the chip after chip dicing, each of these bond pads is physically bonded to a wire (assuming wire bonding technology is used for forming connections between the bond pads and the package enclosing the chip). The wire itself is physically connected to a package pin of the package via an inner lead line of the package. The vast majority of chips will be tested at wafer test. Conventionally, wafer testing uses the bond pads to electrically access the devices of the chips. This results in the bond pads being damaged, which is undesirable for the assembly process.

As a result, there is a need for a structure (and a method for forming the same) in which wafer testing is performed without damaging the bond pads.

SUMMARY OF THE INVENTION

The present invention provides a semiconductor structure, comprising (a) a substrate having a top substrate surface; (b) an integrated circuit on the top substrate surface, wherein the integrated circuit includes a first bond pad electrically connected to a first transistor of the integrated circuit; (c) a first protection ring on the top substrate surface and on a perimeter of the integrated circuit; (d) a kerf region on the top substrate surface, wherein the first protection ring is sandwiched between and physically isolates the integrated circuit and the kerf region, wherein the kerf region includes a first probe pad electrically connected to the first bond pad, and wherein the kerf region is adapted to be destroyed by chip dicing without damaging the integrated circuit and the first protection ring.

The present invention also provides a semiconductor structure, comprising (a) a substrate having a top substrate surface; (b) N integrated circuits on the top substrate surface, wherein each integrated circuit of the N integrated circuits includes M bond pads so that the N integrated circuits includes M×N bond pads, M and N being positive integers and N>1; (c) N first protection rings on the top substrate surface, on perimeters of the N integrated circuits, and associated one-to-one to the N integrated circuits; (d) a kerf region on the top substrate surface, wherein each protection ring of the N first protection rings is sandwiched between and physically isolates its associated integrated circuit and the kerf region, wherein the kerf region includes M×N probe pads electrically connected one-to-one to the M×N bond pads, and wherein the kerf region is adapted to be destroyed by chip dicing without damaging the N integrated circuits and the N first protection rings.

The present invention also provides a structure fabrication method, comprising providing a substrate; simultaneously forming on the substrate (i) a device of an integrated circuit and (ii) an electrically conducting bridging region; simultaneously fabricating (i) an electric conducting path of the integrated circuit from the device, (ii) a protection ring on the substrate, and (iii) a kerf region on the substrate, wherein the protection ring is sandwiched between and physically isolates (a) the kerf region and (b) the device and the electric conducting path of the integrated circuit; after said simultaneously forming and said simultaneously fabricating are performed, simultaneously creating (i) a bond pad electrically coupled to the electric conducting path and (ii) a probe pad directly on the kerf region, wherein the probe pad and the bond pad are electrically connected via the electrically conducting bridging region.

The present invention provides a structure (and a method for forming the same) in which wafer testing is performed without damaging the bond pads.

DETAILED DESCRIPTION OF THE INVENTION

Figure 1:
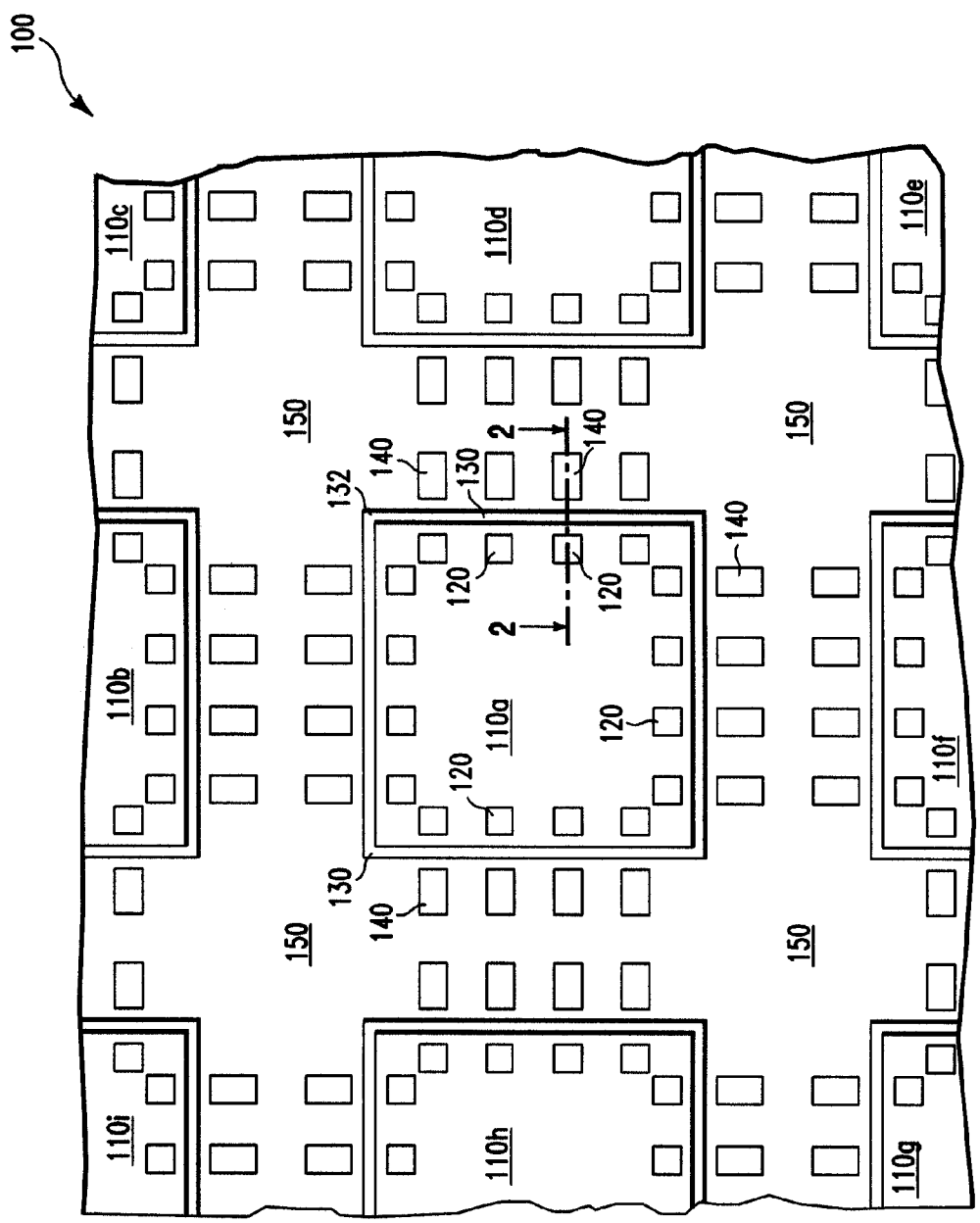
FIG. 1 illustrates a top down view of a wafer, in accordance with embodiments of the present invention.

FIG. 1 illustrates a top down view of a wafer 100, in accordance with embodiments of the present invention. For illustration, the wafer 100 comprises 9 integrated circuits (i.e., chips) 110a-110i and other structures associated with the chips 110a-110i. In general, the wafer 100 can comprise N chips, N being a positive integer. Of the chips 110a-110i, only the chip 110a and its associated structures are fully described and fully shown in FIG. 1. The wafer 100 further comprises a kerf region 150 (i.e., dicing channels) physically separating the chips 110a-110i. During chip separation (i.e., chip dicing), in one embodiment, a blade (not shown) can be used to cut along the kerf region 150 so as to separate the chips 110a-110i from each other.

In one embodiment, the chip 110a comprises, illustratively, 16 bond pads 120 (comprising aluminum in one embodiment) and is surrounded on the chip's perimeter by a protection ring 130. Associated with the chip 110a are 16 probe pads 140 (comprising aluminum in one embodiment) which are electrically coupled one-to-one to the 16 bond pads 120 of the chip 110a. In one embodiment, the 16 probe pads 140 of the chip 110a reside on the kerf region 150. Similarly, each of the other chips 110b-110i of the wafer 100 has 16 bond pads, a protection ring, and 16 probe pads residing on the kerf region 150.

In one embodiment, before chip dicing, wafer testing is performed using the probe pads 140 of the chips 110a-110i to electrically access the devices of the chips 110a-110i instead of using the bond pads 140 of the chips 110 b-110i. As a result, damage to the bond pads 120 due to wafer test probing is avoided.

Figure 2A:
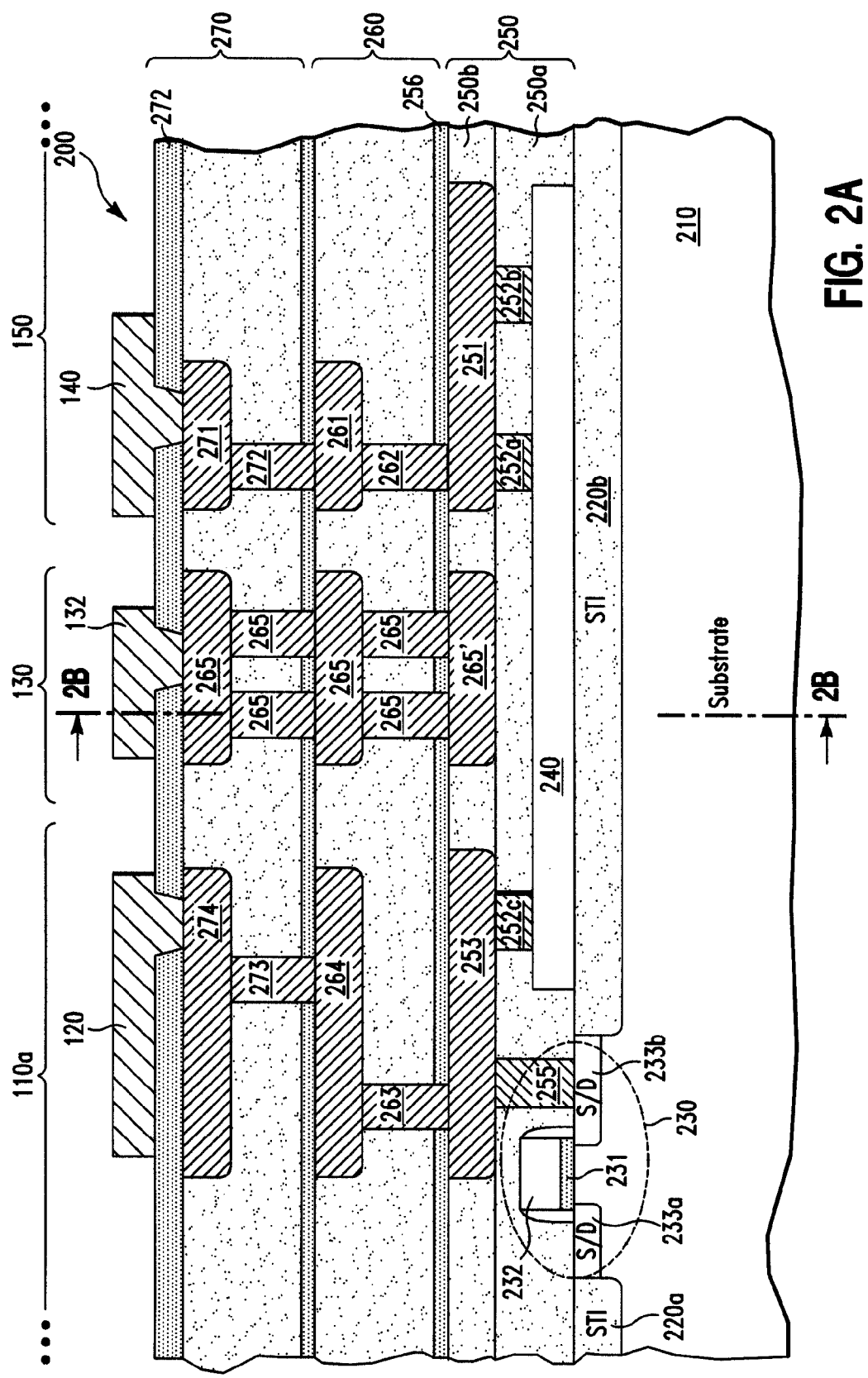
FIGS. 2-4 illustrate three different embodiments of the wafer of FIG. 1.
Figure 2B:
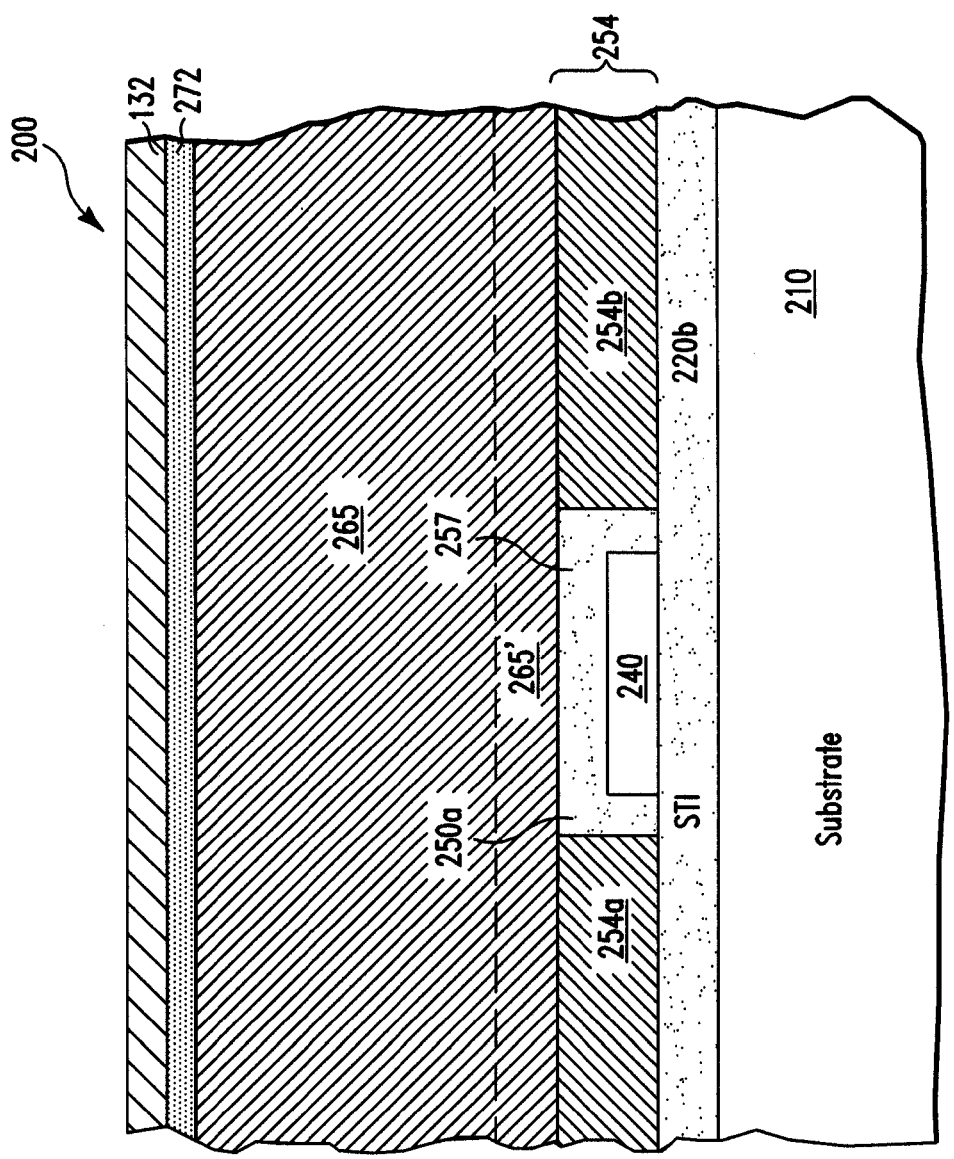

FIG. 2A illustrates a wafer 200 as one embodiment of the wafer 100 of FIG. 1 viewed along a line 2-2 (FIG. 1), whereas FIG. 2B illustrates a view of the wafer 200 of FIG. 2A along a line 2B-2B (FIG. 2A) in accordance with embodiments of the present invention.

More specifically, with reference to both FIGS. 2A and 2B, in one embodiment, the wafer 200 comprises a semiconductor (silicon in one embodiment) substrate 210 and a transistor 230 on the substrate 210. The transistor 230 is electrically isolated from other devices (not shown) on the wafer 200 by shallow trench isolation (STI) regions 220a and 220b. In addition, the wafer 200 further comprises a stack of, illustratively, three inter-level dielectric layers (IDL layers) 250, 260, and 270 on top of the transistor 230 and the STI regions 220a and 220b. In one embodiment, the IDL layer 250 comprises dielectric layers 250a and 250b. Illustratively, the dielectric layer 250a comprises BPSG (boro-phospho-silicate glass), whereas the dielectric layer 250b comprises a low-K (K <3.5, wherein K is dielectric constant) dielectric material.

In the IDL layer 250, there is a bridging polysilicon region 240 that helps electrically couple the probe pad 140 to the bond pad 120. As a result, wafer testing can be performed using the probe pad 140 instead of using the bond pad 120 so as to avoid damage to the bond pad 120.

In each of the IDL layers 250, 260, and 270, there are metal (copper in one embodiment) lines and vias that, together with the bridging polysilicon region 240, provide electrical connections from the bond pad 120 and the probe pad 140 to each other and to the transistor 230. More specifically, one electrical path starting from the probe pad 140 and ending at the bond pad 120 goes through copper line 271, via 272, copper line 261, via 262, copper line 251, vias 252a and 252b, the bridging polysilicon region 240, via 252c, copper line 253, via 263, copper line 264, via 273, and copper line 274. Another electrical path starting from the probe pad 140 and ending at the transistor 230 goes through copper line 271, via 272, copper line 261, via 262, copper line 251, vias 252a and 252b, the bridging polysilicon region 240, via 252c, copper line 253, and the via 255.

In one embodiment, the protection ring 130 extends from top of the wafer 200 down to the STI region 220b (including the STI region 220b) and is adapted to serve as a crack stop ring (that prevents cracking, if any, from propagating from the kerf region 150 into the chip 110a) as well as an edge seal ring (that prevents mobile ions from diffusing into the chip 110a).

In the BPSG layer 250a, the protection ring 130 comprises a metal (tungsten W in one embodiment) ring 254 (visible in FIG. 2B but not in FIG. 2A) running on a perimeter of the chip 110a. In the low-K dielectric layer 250b and the upper IDL layers 260 and 270, the protection ring 130 comprises a copper ring 265 (including a bottom copper ring portion 265') running on the perimeter of the chip 110a. Directly above the copper ring 265 is a top ring portion 132 (comprising aluminum in one embodiment) running on the perimeter of the chip 110a.

The protection ring 130 has an opening 257 (FIG. 2B) which allows the bridging polysilicon region 240 to tunnel through the protection ring 130 without being in direct physical contact with any electrically conducting portions of the protection ring 130 (i.e., the W ring 254 and the bottom copper ring portion 265'). More specifically, the bridging polysilicon region 240 is physically and electrically isolated from the W ring 254 and the bottom copper ring portion 265' by the BPSG layer 250a.

In one embodiment, the wafer 200 comprises an additional ring (not shown) similar to the protection ring 130 and running in parallel to the protection ring 130 on a perimeter of the chip 110a to serve as a crack stop ring whereas the protection ring 130 serves as an edge seal ring. The additional ring is sandwiched between the protection ring 130 and the kerf region 150 and helps prevent cracking from propagating from the kerf region 150 into the chip 110a, whereas the edge seal ring 130 helps prevent mobile ions from diffusing into the chip 110a. The additional ring is not to be destroyed during chip dicing.

In one embodiment, the fabrication of the wafer 200 of FIGS. 2A and 2B is as follows. First, the STI regions 220a and 220b are formed on the substrate 210. Next, a thin dielectric layer (not shown) is grown on exposed-to-ambient top surfaces of the substrate 210 by, illustratively, thermal oxidation. A portion of the thin thermal oxide layer will subsequently become the gate dielectric layer 231 of the transistor 230.

Next, in one embodiment, a bridging polysilicon layer (not shown) is deposited (by chemical vapor deposition or CVD in one embodiment) on top of the thin thermal oxide layer and the STI regions 220a and 220b and then selectively etched back so as to simultaneously form (i) the gate region 232 of the transistor 230 and (ii) the bridging polysilicon region 240.

Next, in one embodiment, the thin thermal oxide layer is etched so as to form the gate dielectric 231 of the transistor 230. Next, source/drain (S/D) regions 233a and 233b are formed on two opposing sides of the gate region 232 using any conventional method. Next, silicide regions (not shown) can be formed on top of the S/D regions 233a and 233b, the gate region 232, and the bridging polysilicon region 240 using any conventional method.

Next, in one embodiment, the BPSG layer 250a is formed on top of the entire wafer 200 and then planarized. Next, openings 252a, 252b, 252c, and 255 (visible in FIG. 2A but not in FIG. 2B) and trenches 254a and 254b (visible in FIG. 2B but not in FIG. 2A) are formed in the BPSG layer 250a and then filled with tungsten (W) using any conventional method so as to form W-filled vias 252a, 252b, 252c, and 255 and the W ring 254.

Next, in one embodiment, the low-K dielectric layer 250b is formed on top of the entire wafer 200 and then planarized. Next, the trenches 253, 265', and 251 are formed in the low-K dielectric layer 250b such that the W-filled vias 252a, 252b, 252c, and 255 and the W ring 254 are exposed to the surrounding ambient. Then, the trenches 253, 265', and 251 are filled with copper using any conventional method so as to form (i) the copper lines 253 in direct physical contact with the W vias 252c and 255, (ii) the copper line 251 in direct physical contact with the W vias 252a and 252b, and (iii) the bottom copper ring portion 265' in direct physical contact with the W ring 254 (FIG. 2B).

Next, a nitride layer 256 is formed on top of the entire wafer 200. Next, the upper IDL layers 260 and 270 and the copper lines and vias therein are formed in a similar manner. Finally, an aluminum layer (not shown) is formed on top of the entire wafer 200 and selectively etched back so as to simultaneously create (i) the bond pads 120, (ii) the top aluminum ring portion 132 of the protection ring 130, and (iii) the probe pads 140.

Figure 3A:
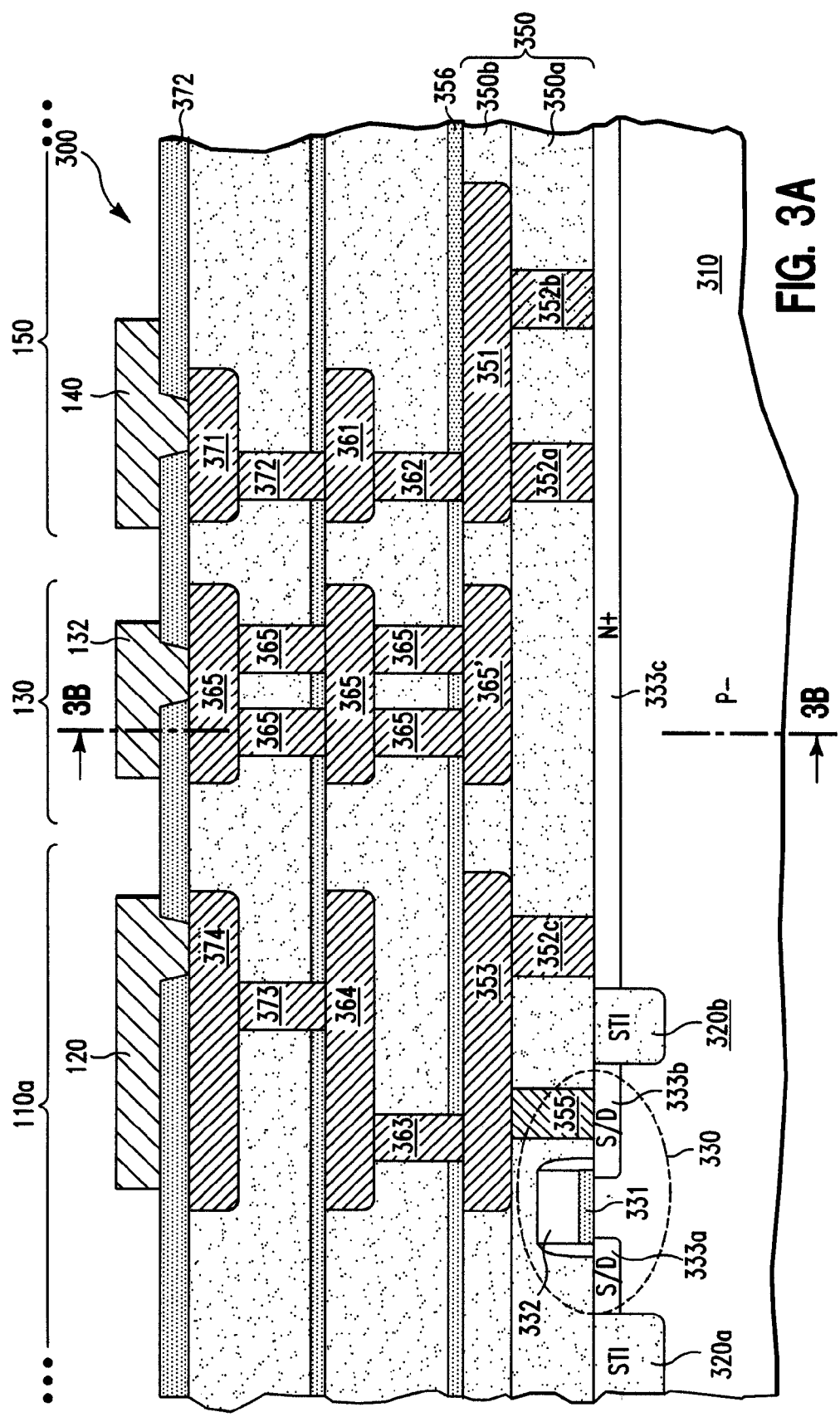
Figure 3B:
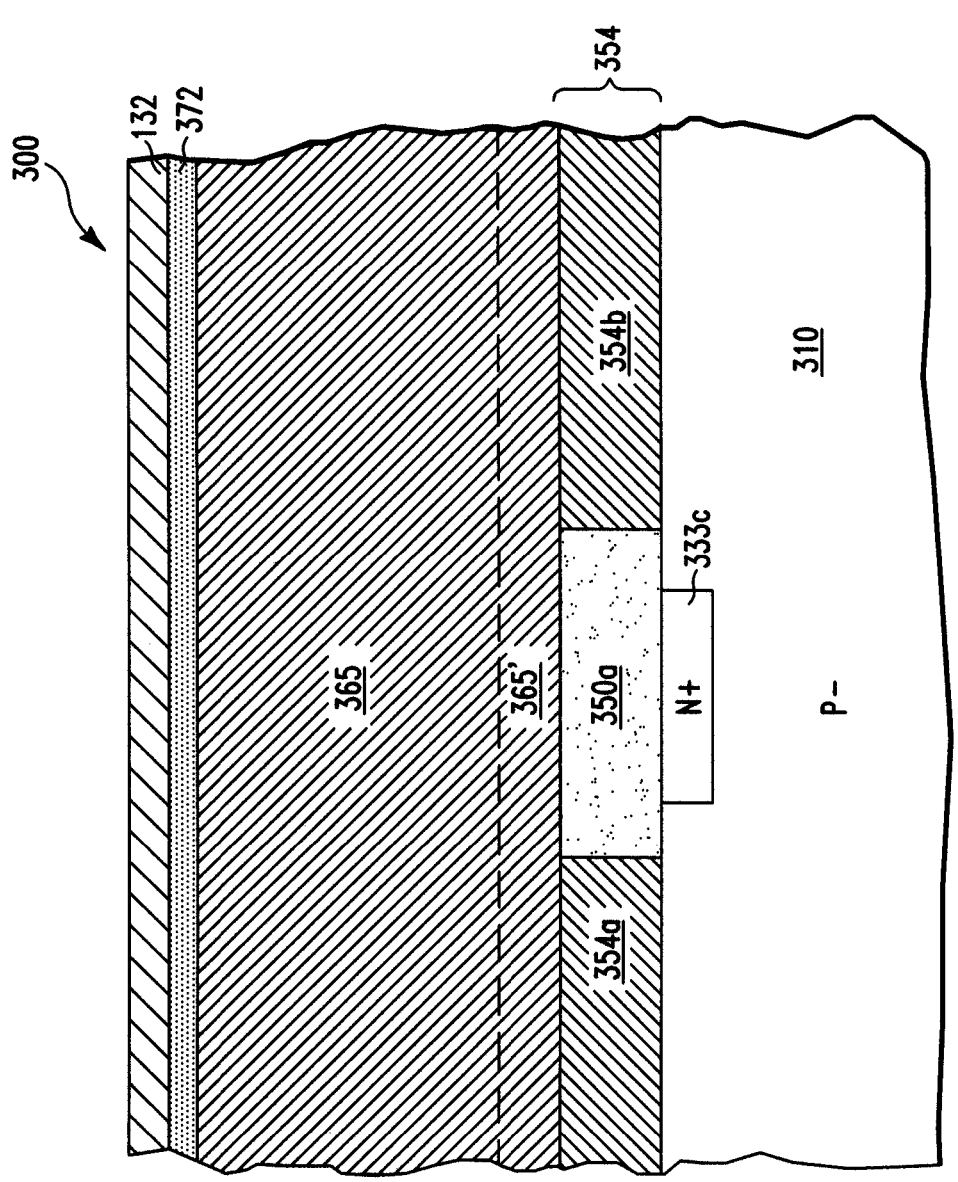

FIG. 3A illustrates a wafer 300 as one embodiment of the wafer 100 of FIG. 1 viewed along a line 2-2 (FIG. 1), whereas FIG. 3B illustrates a view of the wafer 300 of FIG. 3A along a line 3B-3B (FIG. 3A) in accordance with embodiments of the present invention.

The wafer 300 is similar to the wafer 200 of FIGS. 2A and 2B, except that a bridging doped region 333c (as opposed to the bridging polysilicon region 240 of FIGS. 2A and 2B) helps electrically couple the probe pad 140 to the bond pad 120. More specifically, the electrical path starting from the probe pad 140 and ending at the bond pad 120 goes through copper line 371, via 372, copper line 361, via 362, copper line 351, vias 352a and 352b, the bridging doped region 333c, via 352c, copper line 353, via 363, copper line 364, via 373, and copper line 374. As a result, wafer testing can be performed using the probe pad 140 instead of using the bond pad 120 so as to avoid damage to the bond pad 120.

For simplicity, all reference numerals herein have three numeric digits starting with the numeric figure number. In addition, similar regions have the identical reference numerals except for the first digit which is used to indicate the numeric figure number. For example, the substrate 210 (FIGS. 2A and 2B) and the substrate 310 (FIGS. 3A and 3B) are similar.

In one embodiment, the fabrication of the wafer 300 of FIGS. 3A and 3B is as follows. First, the STI regions 320a and 320b are formed on the substrate 310. Next, a thin dielectric layer (not shown) is grown on exposed-to-ambient top surfaces of the substrate 310 by, illustratively, thermal oxidation. A portion of the thin thermal oxide layer will subsequently become the gate dielectric layer 331 of the transistor 330.

Next, in one embodiment, a polysilicon gate layer (not shown) is deposited (by chemical vapor deposition or CVD in one embodiment) on top of the thin thermal oxide layer and the STI regions 320a and 320b and then selectively etched back so as to form the polysilicon gate region 332 of the transistor 330.

Next, in one embodiment, the thin thermal oxide layer is etched so as to form the gate dielectric 331 of the transistor 330. Next, in one embodiment, S/D regions 333a and 333b and the bridging doped region 333c are simultaneously formed by, illustratively, ion implantation. Assume the substrate 310 is doped P type (e.g., doped with boron atoms), then the S/D regions 333a and 333b and the bridging doped region 333c can be doped N type (e.g., doped with phosphorous atoms). In general, the bridging doped region 333c is doped with a doping polarity opposite to the doping polarity of the substrate 310. Next, in one embodiment, a silicide layer (not shown) can be then formed on the bridging doped region 333c, the gate 332, and the source/drain junctions 333a and 333b. The rest of the formation of the wafer 300 is similar to that of the wafer 200 of FIGS. 2A and 2B.

It should be noted that the bridging doped region 333c goes under the protection ring 130 so as to electrically connect the probe pad 140 to the bond pad 120 without being in direct physical contact with any electrically conducting portions of the protection ring 130 (i.e., the W ring 354 and the bottom copper ring portion 365'). More specifically, the bridging doped region 333c is physically and electrically isolated from the W ring 354 and the bottom copper ring portion 365' of the protection ring 130 by the BPSG layer 350a.

Figure 4A:
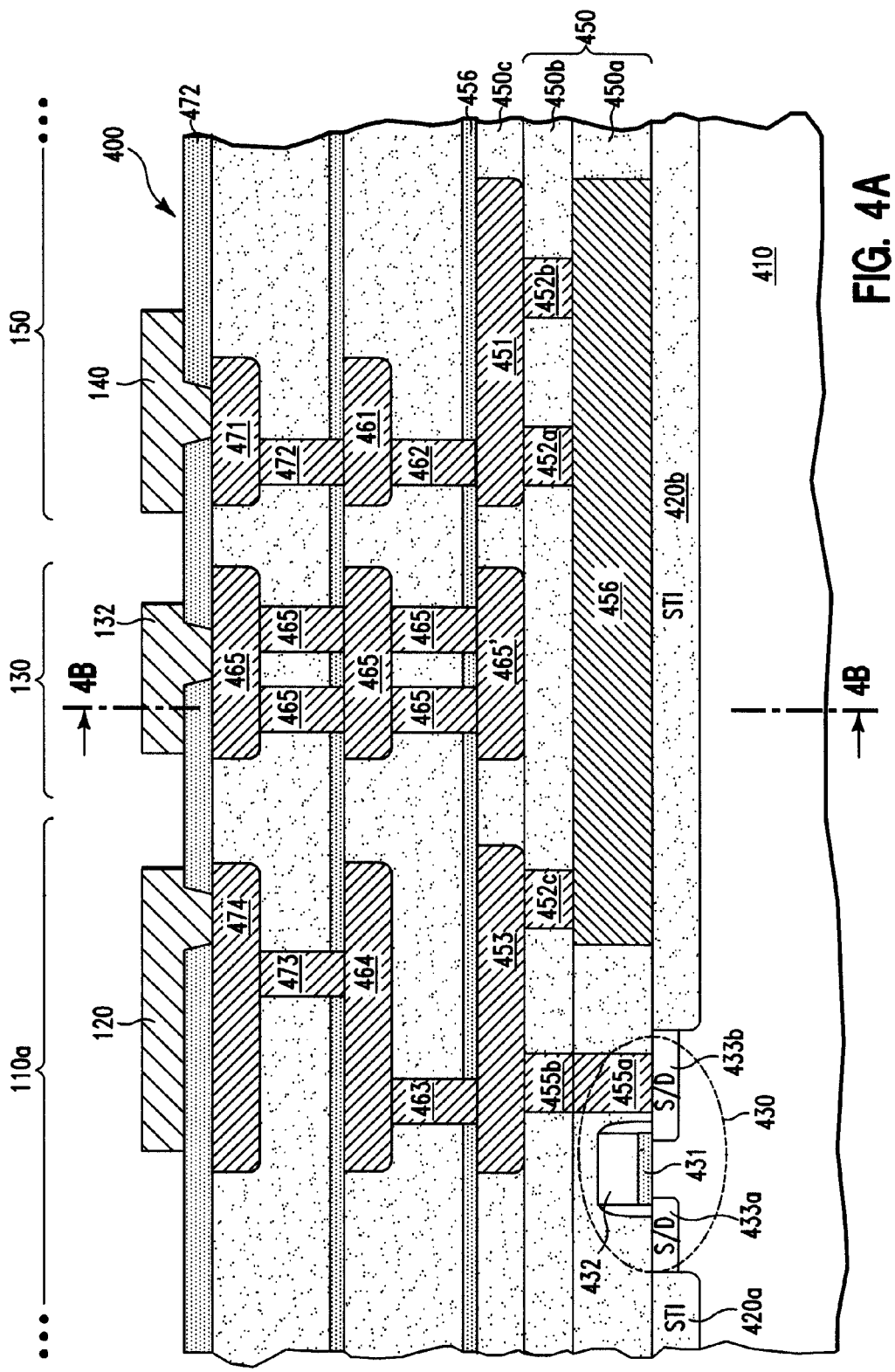
Figure 4B:
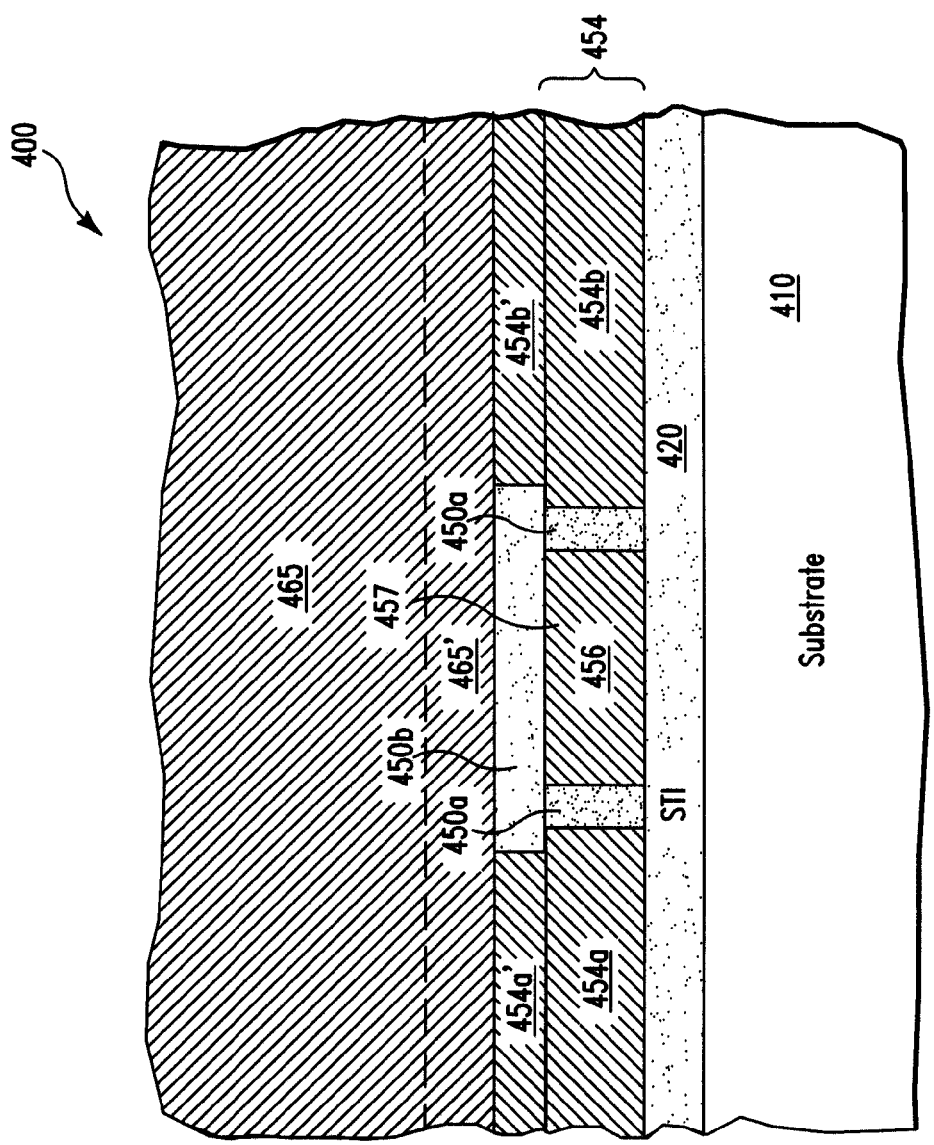

FIG. 4A illustrates a wafer 400 as one embodiment of the wafer 100 of FIG. 1 viewed along a line 2-2 (FIG. 1), whereas FIG. 4B illustrates a view of the wafer 400 of FIG. 4A along a line 4B-4B (FIG. 4A) in accordance with embodiments of the present invention.

The wafer 400 is similar to the wafer 200 of FIGS. 2A and 2B, except that a bridging metal (tungsten in one embodiment) line 456 (as opposed to the bridging polysilicon region 240 of FIGS. 2A and 2B) helps electrically couple the probe pad 140 to the bond pad 120. More specifically, one electrical path starting from the probe pad 140 and ending at the bond pad 120 goes through copper line 471, via 472, copper line 461, via 462, copper line 451, vias 452a and 452b, the bridging W line 456, via 452c, copper line 453, via 463, copper line 464, via 473, and copper line 474. As a result, wafer testing can be performed using the probe pad 140 instead of using the bond pad 120 so as to avoid damage to the bond pad 120.

In one embodiment, the fabrication of the wafer 400 of FIGS. 4A and 4B is as follows. First, the STI regions 420a and 420b are formed on the substrate 410. Next, a thin dielectric layer (not shown) is grown on exposed-to-ambient top surfaces of the substrate 410 by, illustratively, thermal oxidation. A portion of the thin thermal oxide layer will subsequently become the gate dielectric layer 431 of the transistor 430.

Next, in one embodiment, a polysilicon gate layer (not shown) is deposited (by chemical vapor deposition or CVD in one embodiment) on top of the thin thermal oxide layer and the STI regions 420a and 420b and then selectively etched back so as to form the polysilicon gate region 432 of the transistor 430.

Next, in one embodiment, the thin thermal oxide layer is etched so as to form the gate dielectric 431 of the transistor 430. Next, S/D regions 433a and 433b are formed by, illustratively, ion implantation.

Next, in one embodiment, the BPSG layer 450a is formed on top of the entire wafer 400 and then planarized. Next, an opening 455a and trench 456 (visible in FIG. 4A but not in FIG. 4B) and trenches 454a and 454b (visible in FIG. 4B but not in FIG. 4A) are formed in the BPSG layer 450a and then filled with tungsten (W) so as to form (i) the W via 455a, (ii) the bridging W line 456, and a bottom portion 454a, 454b of the W ring 454 of the protection ring 130.

Next, in one embodiment, an oxide layer 450c is formed on top of the entire wafer 400. Next, openings 452a, 452b, 452c, and 455b (visible in FIG. 4A but not in FIG. 4B) and trenches 454a' and 454b' (visible in FIG. 4B but not in FIG. 4A) are formed in the oxide layer 450c and then filled with tungsten (W) using any conventional method so as to form (i) W-filled vias 452a, 452b, 452c, and 455b and (ii) a top portion 454a', 454b' of the W ring 454 of the protection ring 130. The rest of the fabrication of the wafer 400 is similar to that of the wafer 200 of FIGS. 2A and 2B.

It should be noted that the bridging W line 456 goes through an opening 457 in the protection ring 130 without being in direct physical contact with any electrically conducting portions of the protection ring 130 (i.e., the W ring 454 and the bottom copper ring portion 465'). More specifically, the bridging W line 456 is physically and electrically isolated from the W ring 454 and the bottom copper ring portion 465' of the protection ring 130 by the BPSG layer 450a and the oxide layer 450b.

In summary, with reference to FIGS. 1-4, each probe pad 140 is formed (i) on the kerf region 150 and (ii) with electrical coupling to its associated bond pad 120 via an electrical connection. The electrical connection comprises a bridging region that either goes through an opening in the protection ring 130 or goes under the protection ring 130 without being in direct physical contact with or electrically connected to any electrically conducting portions of the protection ring 130. As a result, wafer testing of the chips 110a-110i can be performed using the probe pads 140 instead of the bond pads 130. Therefore, the bond pads 130 remain intact and can be subsequently used for wire bonding after chip dicing (i.e., chip separation).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
   (a) a substrate having a top substrate surface;
   (b) an integrated circuit on the top substrate surface, wherein the integrated circuit includes a first bond pad electrically connected to a first transistor of the integrated circuit;
   (c) a first protection ring on the top substrate surface and on a perimeter of the integrated circuit;
   (d) a dicing region on the top substrate surface,
       wherein the first protection ring is sandwiched between and physically isolates the integrated circuit and the dicing region, and
   wherein the dicing region includes a first probe pad electrically connected to the first bond pad through a first electrically conductive region, wherein the first electrically conductive region comprises polysilicon, wherein the first protection ring comprises a first portion, a second portion, and a third portion, wherein the first portion of the first protection ring comprises copper (Cu), wherein the second and third portions of the first protection ring comprise tungsten (W), wherein the first electrically conductive region is disposed between but not electrically coupled to the second and third portions of the first protection ring, wherein the first electrically conductive region is on and in direct physical contact with a first shallow trench isolation (STI) region of the substrate, wherein the first electrically conductive region is surrounded by the first STI region and a first dielectric cap region, wherein the first dielectric cap region comprises BPSG (boro-phospho-silicate glass), and wherein the first dielectric cap region is sandwiched between and in direct physical contact with both the first protection ring and the first electrically conductive region.

2. The structure of claim 1, further comprising a second protection ring on the top substrate surface, wherein the second protection ring is sandwiched between and physically isolates the first protection ring and the dicing region, wherein the first protection ring is configured to prevent mobile ion diffusion, and wherein the second protection ring is configured to prevent cracking from propagating from the dicing region to the integrated circuit.

3. The structure of claim 1, wherein the integrated circuit further includes a second bond pad electrically connected to a second transistor of the integrated circuit, and wherein the dicing region further includes a second probe pad electrically connected to the second bond pad through a second electrically conductive region, wherein the second electrically conductive region comprises polysilicon, wherein the first protection ring further comprises a fourth portion, a fifth portion, and a sixth portion, wherein the fourth portion of the first protection ring comprises copper (Cu), wherein the fifth and sixth portions of the first protection ring comprise tungsten (W), wherein the second electrically conductive region is disposed between but not electrically coupled to the fifth and sixth portions of the first protection ring, wherein the second electrically conductive region is on and in direct physical contact with a second shallow trench isolation (STI) region of the substrate, wherein the second electrically conductive region is surrounded by the second STI region and a second dielectric cap region, wherein the second dielectric cap region comprises BPSG, and wherein the second dielectric cap region is sandwiched between and in direct physical contact with both the first protection ring and the second electrically conductive region.

4. The structure of claim 3, wherein the first and second probe pads and the first and second bond pads comprise aluminum.

5. A semiconductor structure, comprising:
(a) a substrate having a top substrate surface;
(b) N integrated circuits on the top substrate surface, wherein each integrated circuit of the N integrated circuits includes M bond pads so that the N integrated circuits includes M×N bond pads, M and N being positive integers and N>1;
(c) N first protection rings on the top substrate surface, on perimeters of the N integrated circuits, and associated one-to-one to the N integrated circuits;
(d) a dicing region on the top substrate surface, wherein each protection ring of the N first protection rings is sandwiched between and physically isolates its associated integrated circuit and the dicing region, and wherein the dicing region includes M×N probe pads electrically connected one-to-one to the M×N bond pads through M×N electrically conductive regions, wherein the M×N electrically conductive regions comprise polysilicon, wherein for each electrically conductive region of the M×N electrically conductive regions, the first protection ring comprises a first portion, a second portion, and a third portion, wherein the first portion of the first protection ring comprises copper (Cu), wherein the second and third portions of the first protection ring comprise tungsten (W), wherein the each electrically conductive region is disposed between but not electrically coupled to the second and third portions of the first protection ring, wherein the each electrically conductive region is on and in direct physical contact with a shallow trench isolation (STI) region of the substrate, wherein the each electrically conductive region is surrounded by the STI region and a dielectric cap region, wherein the dielectric cap region comprises BPSG (boro-phospho-silicate glass), and wherein the dielectric cap region is sandwiched between and in direct physical contact with both the first protection ring and the each electrically conductive region.

6. The structure of claim 5, wherein N>2 and M>2.

7. The structure of claim 5, wherein the M×N probe pads and the M×N bond pads comprise aluminum.

8. The structure of claim 5, further comprising N second protection rings (i) on the top substrate surface and (ii) associated one-to-one with the N first protection rings, wherein each protection ring of the N second protection rings is sandwiched between and physically isolates its associated first protection ring and the dicing region, wherein the N first protection rings are configured to prevent mobile ion diffusion, and wherein the N second protection rings are configured to prevent cracking from propagating from the dicing region to the N integrated circuits.

* * * * *